(12) United States Patent
Vick

(10) Patent No.: US 9,576,889 B2
(45) Date of Patent: Feb. 21, 2017

(54) THREE-DIMENSIONAL ELECTRONIC PACKAGES UTILIZING UNPATTERNED ADHESIVE LAYER

(71) Applicant: Research Triangle Institute, Research Triangle Park, NC (US)

(72) Inventor: Erik Paul Vick, Raleigh, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 14/408,887

(22) PCT Filed: Jun. 25, 2013

(86) PCT No.: PCT/US2013/047612
§ 371 (c)(1),
(2) Date: Dec. 17, 2014

(87) PCT Pub. No.: WO2014/004504
PCT Pub. Date: Jan. 3, 2014

(65) Prior Publication Data
US 2015/0187691 A1    Jul. 2, 2015

Related U.S. Application Data

(60) Provisional application No. 61/663,893, filed on Jun. 25, 2012.

(51) Int. Cl.
*H01L 23/498* (2006.01)
*H01L 21/768* (2006.01)
(Continued)

(52) U.S. Cl.
CPC ... *H01L 23/49827* (2013.01); *H01L 21/02107* (2013.01); *H01L 21/76898* (2013.01);
(Continued)

(58) Field of Classification Search
CPC .......... H01L 23/49827; H01L 25/0657; H01L 25/50; H01L 24/95; H01L 24/83; H01L 24/29; H01L 21/02107; H01L 21/76898; H01L 25/162; H01L 2924/12042; H01L 2924/0675; H01L 2924/07025; H01L 2924/0665
See application file for complete search history.

(56) References Cited

U.S. PATENT DOCUMENTS

| | | | |
|---|---|---|---|
| 7,271,491 B1 | 9/2007 | Akram | |
| 2001/0005059 A1* | 6/2001 | Koyanagi | H01L 21/8221 257/778 |

(Continued)

FOREIGN PATENT DOCUMENTS

| | | |
|---|---|---|
| JP | 2009-146940 A | 7/2009 |
| JP | 2010-098064 A | 4/2010 |
| WO | 2010114662 A1 | 10/2010 |

OTHER PUBLICATIONS

International Search Report and Written Opinion dated Oct. 18, 2013 for corresponding Int'l. Patent Appl. No. PCT/US2013/047612.

(Continued)

*Primary Examiner* — John P Dulka
*Assistant Examiner* — Charles R Peters
(74) *Attorney, Agent, or Firm* — Olive Law Group, PLLC; David P. Gloekler

(57) ABSTRACT

An electronic package may be fabricated by forming a first layer of insulating material on a first substrate such that the first layer covers a contact pad; forming an opening through the first layer to expose the contact pad; forming an unpatterned second layer on the first layer, the second layer including an adhesive having a viscosity less than that of the first layer, wherein a region of the second layer obstructs the contact pad; removing the region to re-expose the contact (Continued)

pad; aligning a second substrate with the first substrate such that a via of the second substrate is aligned with the opening; bonding the first substrate and the second substrate together at the second layer; and forming an interconnect in contact with the contact pad by depositing a conductive material through the via and the opening.

20 Claims, 4 Drawing Sheets

(51) Int. Cl.
    *H01L 21/02*      (2006.01)
    *H01L 23/00*      (2006.01)
    *H01L 25/00*      (2006.01)
    *H01L 25/065*      (2006.01)
    *H01L 25/16*      (2006.01)

(52) U.S. Cl.
    CPC .............. *H01L 24/29* (2013.01); *H01L 24/83* (2013.01); *H01L 24/95* (2013.01); *H01L 25/0657* (2013.01); *H01L 25/50* (2013.01); *H01L 25/162* (2013.01); *H01L 2224/2919* (2013.01); *H01L 2924/0002* (2013.01); *H01L 2924/0665* (2013.01); *H01L 2924/0675* (2013.01); *H01L 2924/07025* (2013.01); *H01L 2924/12042* (2013.01)

(56) References Cited

U.S. PATENT DOCUMENTS

| | | |
|---|---|---|
| 2004/0219706 A1 | 11/2004 | Wan |
| 2006/0278991 A1 | 12/2006 | Kwon et al. |
| 2007/0045836 A1 | 3/2007 | Kwon et al. |
| 2010/0200992 A1 | 8/2010 | Purushothaman et al. |
| 2010/0270685 A1* | 10/2010 | Vick ..................... H01L 23/481 257/774 |

OTHER PUBLICATIONS

European Search Opinion for related EP Application EP 20130809106 dated Feb. 26, 2016.

International Preliminary Search Report for related PCT Application PCT/US2013/047612 dated Dec. 31, 2014.

* cited by examiner

THREE-DIMENSIONAL ELECTRONIC PACKAGES UTILIZING UNPATTERNED ADHESIVE LAYER

CROSS-REFERENCE TO RELATED APPLICATIONS

This application is the national stage of International Application No. PCT/US2013/047612, filed Jun. 25, 2013, titled "THREE-DIMENSIONAL ELECTRONIC PACKAGES UTILIZING UNPATTERNED ADHESIVE LAYER," which claims priority of U.S. Provisional Patent Application Ser. No. 61/663,893, filed on Jun. 25, 2012, titled THREE-DIMENSIONAL ELECTRONIC PACKAGES UTILIZING UNPATTERNED ADHESIVE LAYER, the contents of both of which are incorporated by reference in this application in their entireties.

FEDERALLY SPONSORED RESEARCH OR DEVELOPMENT

This invention was made with government support under grant N6601-08-1-2018 awarded by the Space and Naval Warfare Systems Center. The government has certain rights in the invention.

TECHNICAL FIELD

The present invention relates generally to electronics fabrication and packaging in which two or more substrates are bonded together in a three-dimensional (3D) or stacked format, and 3D or vertical interconnects are utilized for signal communication between bonded substrates or devices associated with the substrates. In one specific aspect, the invention relates to improved methods for bonding substrates in a 3D configuration and electronic packages resulting therefrom.

BACKGROUND

Conventional microelectronic devices are packaged in a planar or two-dimensional (2D) surface-mount configuration. In this configuration, the package size (particularly the footprint) is dictated by both the number and physical dimensions of the integrated circuit (IC) chips or other discrete devices included in the package, as well as the area occupied by the discrete surface-mounted passive components utilized. There is a continuing demand for smaller electronic products that at the same time provide a higher level of functionality. Hence, there is a concomitant demand for higher-performance, smaller-footprint packaged microelectronic devices for use in such products. In response, researchers continue to develop three-dimensional (3D) integration or chip-stacking technologies as an alternative to the conventional 2D format. By implementing 3D integration, multiple die may be "vertically" arranged (in the third dimension) in a single packaged electronic device, with adjacent die communicating by way of 3D (or "vertical") metal interconnects extending through the thicknesses of the die substrates. 3D integration may be done at the wafer level (wafer-to-wafer bonding), the die level (die-to-die bonding), or in a hybrid format (die-to-wafer bonding). 3D packages can provide various advantages, such as shorter signal propagation delay (and thus faster signal processing), lower power consumption, reduced cross-talk, smaller package footprint, smaller device size, and higher input/output (I/O) count and density. Moreover, the different die stacked in the 3D package may be configured to provide different functions. For example, one die might include an active electronic device while another die might include an arrangement of passive components (resistors, capacitors, inductors, etc.), an array of memory modules, or a ground plane that communicates with several interconnects.

The formation of 3D metal interconnects has generally been accomplished by either a "vias first" approach or a "vias last" approach. In the "vias first" approach, the interconnects are formed prior to circuitry fabrication, substrate thinning, and substrate (die or wafer) bonding. In the "vias last" approach, the interconnects are formed after circuitry fabrication, substrate thinning, and substrate bonding. Particularly in the case of the "vias last" approach, the interconnect metal may need to be deposited through more than one layer of material in order for the metal to land on the surface of a contact pad and form a low-resistance electrical coupling with the contact pad. For example, to reach the contact pad the interconnect metal may need to be deposited through a deep via that extends through the entire thickness of one substrate and possibly partially into the thickness of an adjacent substrate where the contact pad is located, as well as through one or more intervening layers between these two substrates such as bonding layers, insulating layers, passivation layers, etc. Moreover, as a result of preceding material addition steps, an etching step (i.e., "bottom-clear" etching) such as deep reactive ion etching (DRIE) is typically required to expose the contact pad prior to the interconnect metallization step. Effective etching and interconnect metallization steps become more challenging as the aspect ratio (i.e., depth-to-diameter) of the vias increases.

In co-pending U.S. patent application Ser. No. 12/754,396 filed Apr. 5, 2010 (U.S. Pat. App. Pub. No. 2010/0270685), the entire contents of which are incorporated herein by reference, these difficulties are addressed by utilizing a relatively thick, photo-definable adhesive layer as the bonding medium between two substrates. This adhesive layer is deposited on one substrate and patterned to create openings exposing underlying contact pads of the substrate. The two substrates are then bonded together, with the metal pads of the one substrate being aligned with corresponding vias of the other substrate. This approach facilitates the subsequent bottom-clear and interconnect metallization steps. However, the photolithographic patterning process increases cross-linking in the adhesive, which in turn increases the viscosity of the adhesive. Consequently, the bonding conditions will involve higher temperatures and/or higher force relative to less cross-linked (lower viscosity) adhesives. Such bonding conditions may not be compatible with some applications. Moreover, even if the bonding conditions are tolerable, gaps in the bond line may still occur in certain applications.

In view of the foregoing, there continues to be a need for improved methods for fabricating electronic packages, including improved methods for bonding substrates and forming interconnects in 3D configurations.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, a method for fabricating an electronic package includes: forming a first intermediate layer on a first substrate such that the first intermediate layer covers a contact pad disposed on the first substrate, the first intermediate layer comprising an electrically insulating material having a first viscosity; forming an opening through the first intermediate layer to expose the contact pad; forming an un-patterned second intermediate layer on the first intermediate layer, the second intermediate layer comprising an adhesive having a second viscosity less than the first viscosity, wherein a region of the second intermediate layer obstructs the contact pad; removing the region to re-expose the contact pad through the opening; aligning a second substrate with the first substrate such that a via of the second substrate is aligned with the opening; bonding the first substrate and the second substrate together by bringing the second substrate into contact with the second intermediate layer and applying a force to at least one of the first substrate and the second substrate while heating the second intermediate layer; and forming an interconnect in contact with the contact pad by depositing an electrically conductive material through the via and the opening.

In some embodiments, the via is defined by an electrically insulating layer coating an inside wall of the second substrate, and forming the interconnect includes depositing the electrically conductive material on the electrically insulating layer.

In some embodiments, the first intermediate layer is planarized prior to forming the second intermediate layer.

According to another embodiment, an electronic package is provided, which is fabricated according to any of the methods disclosed herein.

According to another embodiment, an electronic package includes: a first substrate; a contact pad disposed on the first substrate; a first intermediate layer disposed on the first substrate, the first intermediate layer comprising an electrically insulating material having a first viscosity and a first opening aligned with the contact pad; a second substrate comprising a via aligned with the first opening, wherein at least one of the first substrate and the second substrate comprises a semiconductor material; a second intermediate layer disposed on the first intermediate layer and having a smaller thickness than the first intermediate layer, the second intermediate layer comprising a second opening aligned with the via, wherein the second intermediate layer comprises an adhesive having a composition sufficient for bonding the second substrate to the second intermediate layer and a second viscosity less than the first viscosity by thermocompression bonding; and an electrically conductive interconnect contacting the contact pad and extending through the first opening, the second opening and the via.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
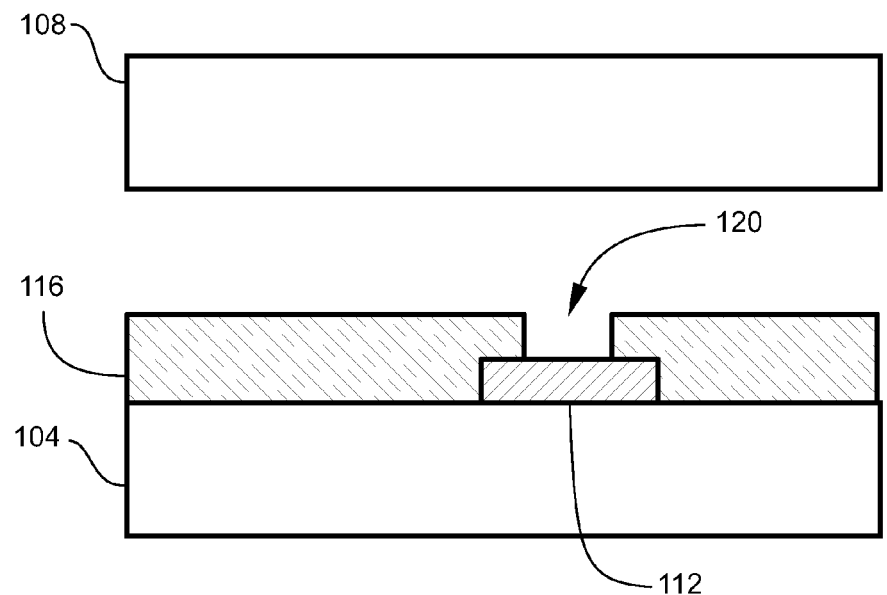
FIG. 1 is a schematic cross-sectional view illustrating an example of a method for fabricating an electronic package according to an embodiment of the present disclosure, in which a patterned first intermediate layer is formed on a first substrate.

FIGS. 1-4 illustrate an example of a method for fabricating an electronic package according to an embodiment of the present disclosure. Referring to FIG. 1, a first substrate 104 and a second substrate 108 are provided. The first substrate 104 and/or the second substrate 108 may be a wafer from which multiple die are singulated before or after bonding. Alternatively, the first substrate 104 and/or the second substrate 108 may be a die singulated from a wafer. Accordingly, the methods disclosed herein may entail wafer-on-wafer bonding, die-on-wafer bonding, or die-on-die bonding. In typical embodiments, at least one of the substrates 104, 108 includes a semiconductor material such as, for example, silicon, silicon-germanium alloy, silicon carbide, a Group III-V compound (e.g., gallium arsenide, gallium nitride, etc.), a Group II-VI compound (e.g., zinc oxide), etc. In some embodiments, one or both of the substrates 104, 108 may include an electrically insulating or dielectric material such as, for example, a glass, a non-conductive oxide, a non-conductive nitride, a ceramic, etc. In some embodiments, one or both of the substrates 104, 108 may include one or more passive electronic components (e.g., resistors, capacitors, interconnects) and/or active electronic components (e.g., transistors), or one or more integrated circuits containing an ordered arrangement of several electronic components. One or both of the substrates 104, 108 may additionally or alternatively include one or more microfabricated mechanical, electromechanical, optical, or radio frequency (RF) transmitting components. Such components or circuitry may be formed on or into the thickness of the substrate 104, 108, and may be considered as being part of a device layer that is disposed on a surface of a base layer constituting the bulk substrate material. Thus, depending on the embodiment, one or both of the substrates 104, 108 may be considered as being a microelectronic device, an optoelectronic device, a micro-electromechanical systems (MEMS) device, etc. Moreover, the two substrates 104 and 108 may be configured to perform different functions. For example, one substrate may be configured as an electronic device that performs logic functions while the other substrate is configured primarily to provide input/output (I/O) signal communication and power supply to the electronic device.

In the example illustrated in FIG. 1, a metallization layer (not shown) is formed on the first substrate 104 by any suitable technique (e.g., vacuum deposition, electroplating, etc.) and then patterned by any suitable technique (e.g., photolithography) to form one or more electrically conductive contact pads (or bond pads, or landing pads) 112 on the first substrate 104. The contact pad 112 may be composed of any suitable electrically conductive material such as, for example, tungsten, tungsten silicide, nickel silicide, aluminum, titanium, titanium-tungsten alloy, copper, aluminum alloy, gold, silver, tin, nickel, or a combination of two or more of the foregoing.

A first intermediate layer 116 is then formed on the first substrate 104 such that the first intermediate layer 116 conformally covers the contact pad(s) 112. The first intermediate layer 116 may be composed of any electrically insulating or dielectric material that is patternable, i.e., may be patterned by a suitable patterning technique such as photolithography. Examples of compositions of the first intermediate layer 116 include, but are not limited to, photoresist, metal oxide (e.g., sapphire), metalloid oxide (e.g., silicon dioxide), metal nitride, metalloid nitride (e.g., silicon nitride), glass, quartz, and diamond-like carbon (DLC). The first intermediate layer 116 may be an epoxy-based photoresist such as, for example, SU-8. In addition to photoresists, the first intermediate layer 116 may be another type of polymer such as, for example, a polyimide (including co-polymers and blends thereof), a polyparaxylylene (i.e., from the family of Parylenes), a liquid crystal polymer (LCP), or benzocyclobutene (BCB). Generally, the material of the first intermediate layer 116 may or may not be photo-definable. If not photo-definable, the material may be patternable in the sense that openings may be formed through its thickness by way of an appropriate microfabrication technique such as micro-drilling, wet etching or dry etching (RIE). Moreover, in the present embodiment the material of the first intermediate layer 116 may or may not be an adhesive (or may or may not include an adhesion promoter). That is, the first intermediate layer 116 may function primarily as a structural or insulating layer between the first substrate 104 and the second substrate 108.

The first intermediate layer 116 may be formed to any desired thickness on the first substrate 104. In some embodiments, the thickness of the first intermediate layer 116 (measured from the surface of the first substrate 104) ranges from 10 to 40 µm. The first intermediate layer 116 may be formed by any technique appropriate for its composition such as, for example, spin-coating, spray-coating, dip-coating, flow-coating, vacuum deposition (e.g., physical vapor deposition or chemical vapor deposition), evaporation, or lamination. After deposition to a desired thickness, the first intermediate layer 116 is then patterned to create a first opening 120 that exposes the contact pad 112 (or an array of first openings 120 that respectively expose multiple contact pads 112) through the thickness of the first intermediate layer 116. As shown in FIG. 1, the cross-sectional area of the first opening 120 may be less than that of the contact pad 112 so that the first substrate 104 remains sealed under the first intermediate layer 116. Prior to forming the first intermediate layer 116, the surface of the first substrate 104 may be prepared as needed (e.g., cleaning/etching, dehydration by baking, etc.)

The material of the first intermediate layer 116 may be patterned by any technique appropriate for its composition, and thus may involve wet and/or dry etching, or micromachining (e.g., mechanical drilling, laser drilling, ultrasonic milling, etc.). The material of the first intermediate layer 116, if it is itself photo-definable, may for example be patterned in accordance with the photolithographic techniques disclosed in above-cited U.S. Patent Application Publication No. 2010/0270685. For example, prior to exposure the material may be pre-baked (or "soft-baked") at a desired temperature for a desired period of time to evaporate excess solvent from the material and partially densify and harden the material in preparation for subsequent process steps. In some embodiments, prior to patterning, the material may be deposited in more than one layers, and each layer may be pre-baked before depositing the next layer. A pattern may then be defined on the material by directing an appropriate type of exposure energy (e.g., UV light, electron beam, x-ray) through a correspondingly patterned photomask or reticle at an appropriate wavelength (e.g., 350-400 nm) and dose (mJ/cm$^2$). After exposure, the material may be subjected to a post-exposure bake (PEB) at a desired temperature for a desired period of time to increase cross-link density. After PEB, the material may be developed by applying a suitable developer chemistry to create the first opening 120 (or a pattern of first openings 120 through the thickness of the material).

After development, the resulting first intermediate layer 116 may be rinsed with a solvent (e.g., isopropyl alcohol and/or water) and dried with a gas (e.g., air or nitrogen). After development, the first intermediate layer 116 may be hard-baked to at least partially cure the material if desired for a particular embodiment. At least partially curing the material may be desirable to prevent reflow of the material during bonding, or otherwise to further harden the material at this stage.

In embodiments where the material of the first intermediate layer 16 is not itself photo-definable, a photoresist layer may be deposited on the material and exposed and developed as just described to create windows that expose areas on the material. A wet or dry etchant is then applied through the windows to the exposed areas to etch the material down to the first substrate 104, thereby creating the first openings 120. The photoresist layer may thereafter be removed from the resulting first intermediate layer 116.

In some embodiments, prior to patterning the first intermediate layer 116 may be planarized if needed or desired to facilitate bonding. The first intermediate layer 116 may be planarized by any technique appropriate for its composition, such as lapping or polishing. As another example, the first intermediate layer 116 may be planarized in accordance with the techniques disclosed in above-cited U.S. Patent Application Publication No. 2010/0270685. In this example a flat plate, such as a glass, polyvinyl acetate (PVA) or polytetrafluoroethylene (PFTE) slide, is brought into contact with the deposited first intermediate layer 116 with an applied force and heated to an appropriate temperature. The force and heat may be applied, for example, by using a wafer/die bonding apparatus. The flat plate is then removed. In some embodiments, the first intermediate layer 116 may then be baked at or around the glass transition temperature $T_g$ of the material to minimize or eliminate residual sites of non-planarity, by causing localized reflow of the material.

Figure 2:
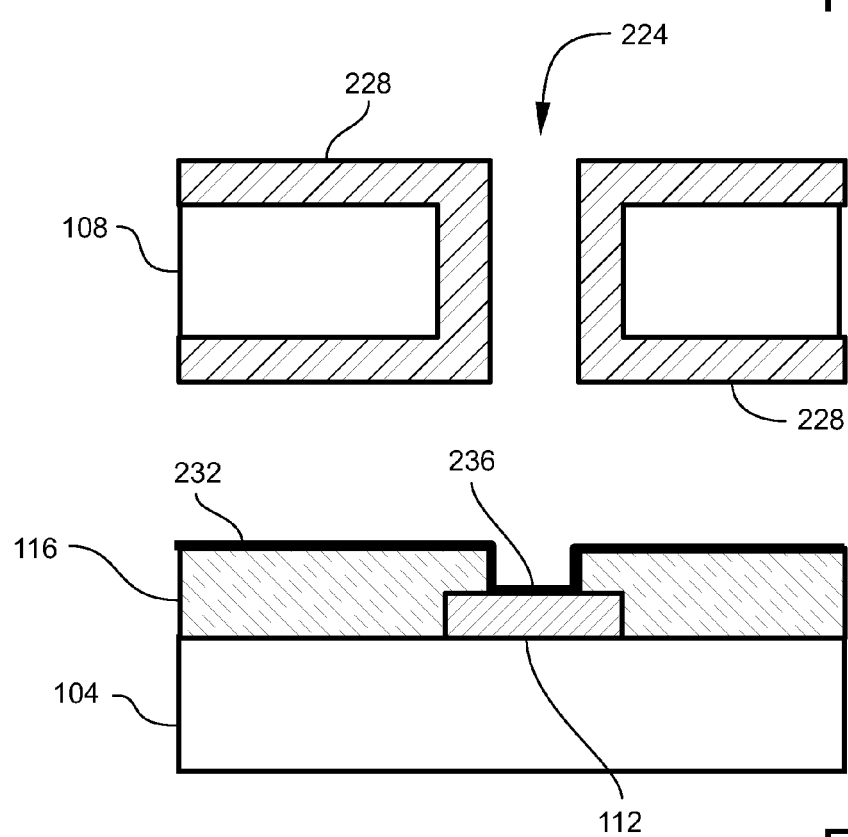
FIG. 2 is a schematic cross-sectional view illustrating the method, in which a second intermediate layer is formed on the first intermediate layer illustrated in FIG. 1, and a via is formed through a second substrate.

Referring to FIG. 2, vias 224 are formed through the entire thickness of the second substrate 108. Depending on the composition and thickness of the second substrate 108 and the size of the vias 224, the vias 224 may be formed by, for example, deep reactive ion etching (DRIE), mechanical or laser drilling, etc. The vias 224 may be formed in a pattern that matches the pattern of first openings 120 of the first substrate 104 when the two substrates 104 and 108 are subsequently aligned in preparation for the bonding process. In some embodiments, a conformal layer 228 of an electrically insulating material may be deposited on the surfaces of the second substrate 108 to electrically isolate the second substrate 108 from the interconnect material subsequently deposited in the vias 224. Any of the insulating materials noted elsewhere in this disclosure may be suitable as the insulating or passivation layer. In some embodiments, via formation may be considered as being a part of the method for fabricating the electronic package. In other embodiments, the second substrate 108 may be provided with pre-existing vias 224, with or without the insulating layer 228.

Again referring to FIG. 2, after forming the first intermediate layer 116, a second intermediate layer 232 is formed on the first intermediate layer 116 such that a region 236 of the second intermediate layer 232 obstructs the contact pad(s) 112. In the present embodiment, the region 236 obstructs the contact pad 112 in that it conformally covers the contact pad(s) 112. The second intermediate layer 232 may be composed of any electrically insulating or dielectric material capable of serving as an adhesive sufficient for bonding the second substrate 108 to the first intermediate layer 116 in the manner described below. The thickness of the second intermediate layer 232 may be less than the thickness of the first intermediate layer 116. In some embodiments, the thickness of the second intermediate layer 232 ranges from 1 to 10 μm. In some embodiments, the thickness of the second intermediate layer 232 ranges from 1% to 25% of the thickness of the first intermediate layer 116. Additionally, the viscosity of the second intermediate layer 232 may be less than the viscosity of the first intermediate layer 116 over the range of temperatures encountered during the subsequent bonding process described below (e.g., 80 to 250° C.). In some embodiments, bonding is done under a condition in which the viscosity of the second intermediate layer 232 ranges from 1% to 99% of the viscosity of the first intermediate layer 116. Examples of compositions of the second intermediate layer include 232, but are not limited to, photoresist, polyimide, polyparaxylylene, LCP, BCB, SU8 and other polymers capable of serving as adhesives in accordance with the present disclosure. The composition of the second intermediate layer 232 may be the same as the composition of the first intermediate layer 116, or may be different.

The second intermediate layer 232 may be formed to a desired thickness by any technique appropriate for its composition such as, for example, spin-coating, spray-coating, dip-coating, flow-coating, lamination, evaporation, etc. In some embodiments, the second intermediate layer 232 is conformally deposited in the first opening 120 such that the second intermediate layer 232 covers all or part of the portion of the contact pad 112 exposed through the first opening 120, and covers all or part of the inside wall of the first intermediate layer 116 defining the first opening 120. The second intermediate layer 232 is not patterned after deposition. Moreover, second intermediate layer 232 is not cured after deposition and thus may contain an insubstantial amount of cross-links. In the present context, the term "insubstantial amount of cross-links" means less than full cross-linking. The amount of cross-linking of the second intermediate layer 232 may be optimized for required bonding results. The cross-linking of the second intermediate layer 232 may thus be less than that of the first intermediate layer 116. In embodiments where the composition of the second intermediate layer 232 is the same as that of the first intermediate layer 116, the viscosity of the second intermediate layer 232 may still be less than the viscosity of the first intermediate layer 116. This is because in such embodiments, the second intermediate layer 232 may have significantly less cross-links than the first intermediate layer 116 or may have no cross-links at all.

Figure 3:
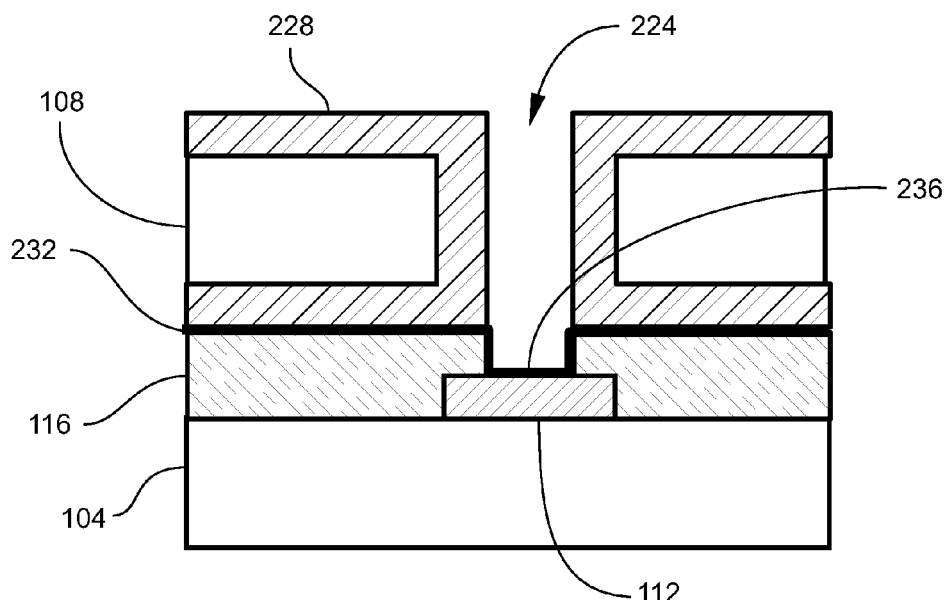
FIG. 3 is a schematic cross-sectional view illustrating the method, in which the two substrates illustrated in FIG. 2 are bonded together.

Referring to FIG. 3, after forming the second intermediate layer 232 the two substrates 104 and 108 are aligned manually or with an alignment tool (which may be part of the bonding apparatus). Specifically, each contact pad 112 (and associated first opening 120) of the first substrate 104 is aligned with a corresponding via 224 of the second substrate 108. The aligned substrates 104 and 108 are then brought into contact with each other with appropriate force (pressure), temperature and time required to bond them together. The force may be applied by mounting the substrates 104 and 108 in a suitable compression (or thermocompression) bonding apparatus, as appreciated by persons skilled in the art. The application of force may entail mounting the first substrate 104 in a fixed manner and forcibly moving the second substrate 108 into contact with the first substrate 104, or vice versa, or by applying a clamping force to both substrates 104 and 108 such that they bear against each other. Hence, in the present context the application of force "to" or "between" the substrates 104 and 108 encompasses any of these bonding techniques. Moreover, in the present embodiment, bringing the two substrates 104 and 108 into contact specifically entails bringing the second substrate 108 into contact with the second intermediate layer 232 formed on the underlying first intermediate layer 116 of the first substrate 104. The application of force and heat creates an effective bond between the two substrates 104 and 108 (i.e., at the interface between the second substrate 108 and the first intermediate layer 116) by way of the intervening, adhesive second intermediate layer 232.

The low viscosity of the un-patterned second intermediate layer 232 enables a lower level of bonding conditions (force, temperature and/or time) while minimizing or even eliminating bond-line gaps, as compared to conventional bonding processes. In particular, bonding may be performed at a lower force and lower temperature. In some embodiments, the bonding force ranges from 0.001 kg/cm$^2$ to 200 kg/cm$^2$. In some embodiments, the bonding temperature ranges from 80 to 250° C. The second intermediate layer 232 need only be heated enough to be tacky and act as an effective adhesive during bonding. By contrast, a greater level of bond optimization would be required if, for example, the patterned first intermediate layer 116 or a conventional adhesive were to be utilized as the primary adhesion layer. Once patterned, a cross-linked material typically has a very high viscosity even at temperatures above its glass transition temperature $T_g$. Consequently, higher temperature and/or higher force are typically required for bonding. Moreover, even with high force/high temperature ($\geq T_g$) bond conditions, gaps in the bond line may occur due to local non-planarities.

Figure 4:
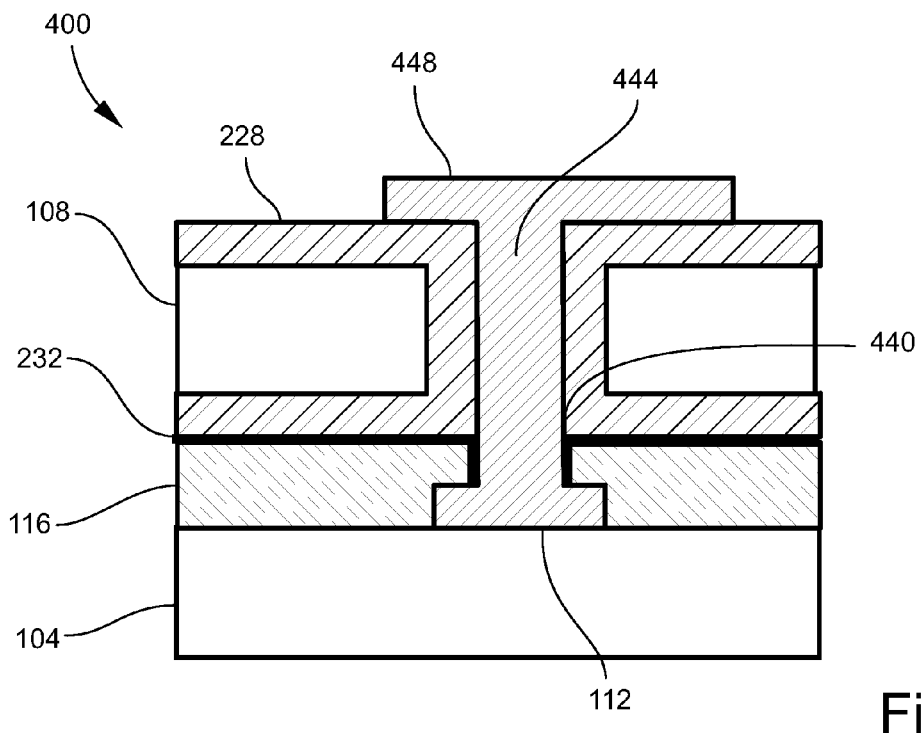
FIG. 4 is a schematic cross-sectional view illustrating the method, in which the second intermediate layer illustrated in FIG. 3 is removed from an underlying contact pad and an interconnect is formed in the via in contact with the contact pad.

Referring to FIG. 4, after bonding, in some embodiments a bottom-clear step may be need to be performed to remove any portion of the second intermediate layer 232 covering the contact pad 112 (i.e., region 236, FIG. 3), thereby re-exposing and cleaning the contact pad 112 in preparation for 3D interconnect metallization in the via 224. Any suitable bottom-clear technique may be utilized such as, for example, DRIE, ion mill, etc. Moreover, the planarity achieved by the underlying first intermediate layer 116 allows minimization of the thickness of the second intermediate layer 232. Thus, a smaller amount of material needs to be removed from the bottom of the first opening 120 relative to thicker, conventional adhesive layers, and the bottom-clear process may be simplified and may be more effective, more reliable and more repeatable. The bottom-clear step may be considered as creating a second opening 440 in the second intermediate layer 232, between the first opening 120 of the first intermediate layer 116 and the corresponding via 224 of the second substrate 108.

Again referring to FIG. 4, after re-opening the contact pad 112, 3D interconnect metallization in the via 224 is performed to form an interconnect 444 that extends through the via 224, second opening 440 and first opening 120, and into low-resistance contact with the contact pad 112. The interconnect material may, for example, be copper, tungsten, titanium, etc. The interconnect material may be deposited by any technique suitable for its composition and the required conformality such as, for example, PVD, CVD (e.g., metalorganic CVD (MOCVD)), electroplating, or evaporation. In some embodiments, the interconnect material fills the via 224 and first opening 120. In other embodiments, the interconnect material is a layer that conformally coats the wall defining the via 224 down to the contact pad 112. After forming the 3D (vertical) interconnect 444, interconnect material 448 on the outer surface of the second substrate 108 may be patterned as needed to form a bond pad or to place the interconnect in signal communication with circuitry on the second substrate 108. As appreciated by persons skilled in the art, other post-bonding and finishing steps may be implemented as needed to complete the fabrication of an electronic package 400 having a desired structural and functional configuration.

Figure 5:
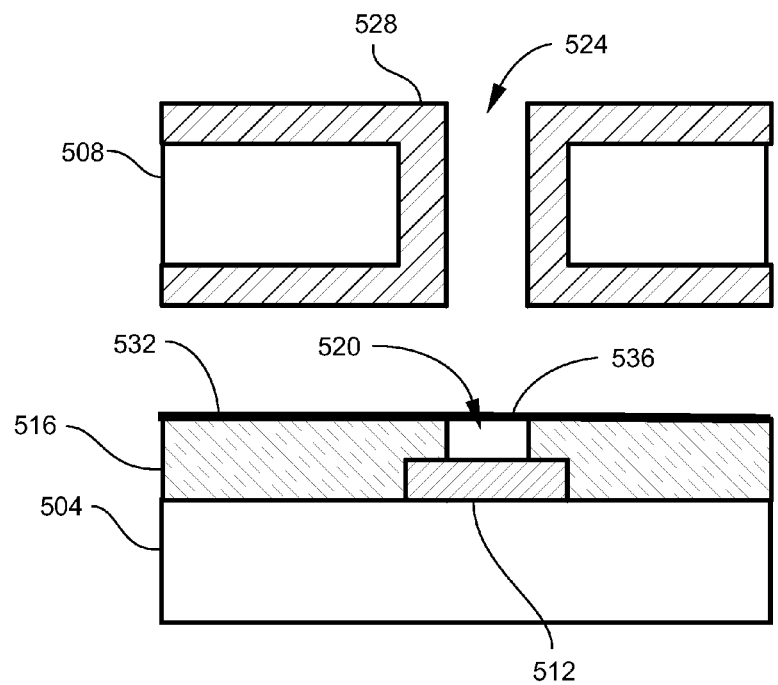
FIG. 5 is a schematic cross-sectional view illustrating an example of a method for fabricating an electronic package according to another embodiment of the present disclosure, in which the second intermediate layer is formed on the patterned first intermediate layer such that an unsupported region of the second intermediate layer is suspended above the contact pad.
Figure 6:
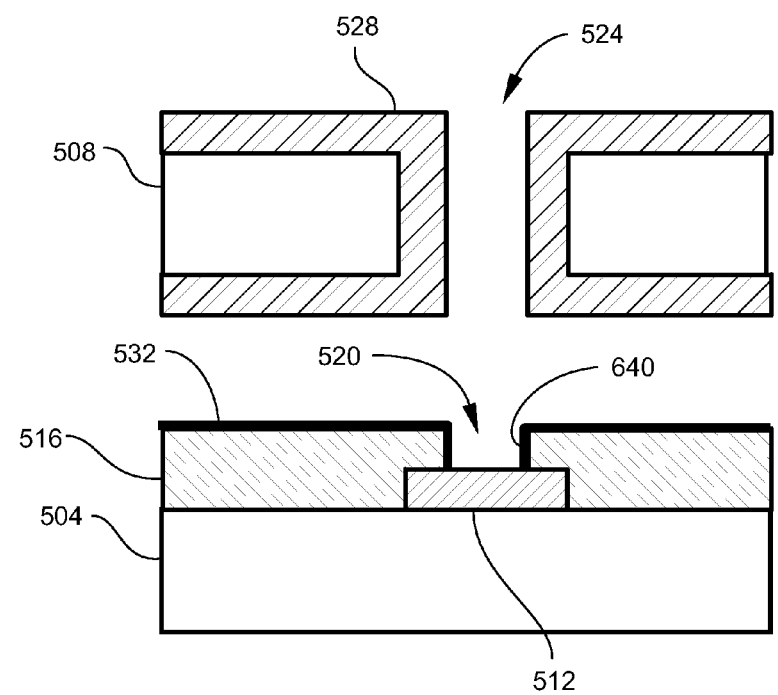
FIG. 6 is a schematic cross-sectional view illustrating the method, in which the unsupported region illustrated in FIG. 5 is removed or effectively removed from the opening by surface tension during reflow heating.
Figure 7:
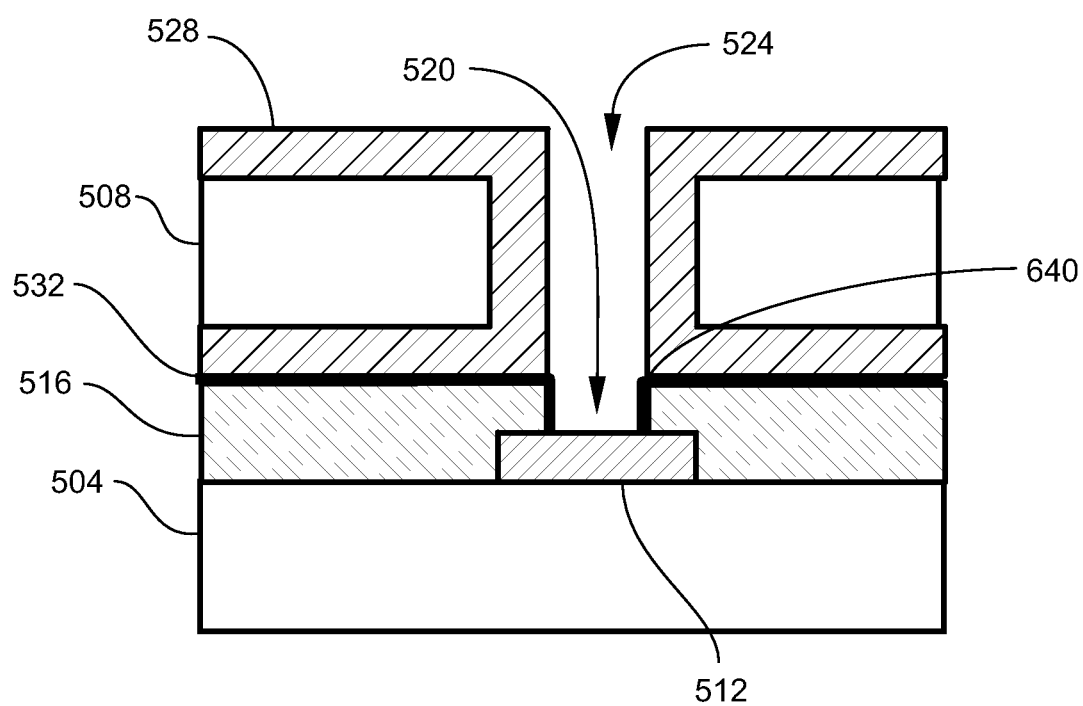
FIG. 7 is a schematic cross-sectional view illustrating the method, in which the two substrates are bonded together.

FIGS. 5-7 illustrate an example of a method for fabricating an electronic package according to another embodiment of the present disclosure. Referring to FIG. 5, a first substrate 504 and a second substrate 508 are provided as described above in conjunction with FIG. 1. A first intermediate layer 516 is then formed (deposited and patterned) on the first substrate 504 so as to include one or more first openings 520 exposing corresponding contact pads 512, as described above in conjunction with FIG. 1. Vias 524 are formed through the entire thickness of the second substrate 508 (or the second substrate 508 is provided with pre-formed vias 524) as described above in conjunction with FIG. 2.

In the presently described embodiment, after forming the first intermediate layer 516 a second intermediate layer 532 is formed on the first intermediate layer 516 such that a region 536 of the second intermediate layer 532 obstructs the contact pad 512. In the present embodiment, the obstruction is a result of the second intermediate layer 532 spanning the first opening 520. That is, the second intermediate layer 532 extends across the first opening 520 without being deposited in the first opening 520, whereby the region 536 is suspended above the contact pad 512 and does not coat the contact pad 512 or the inside wall of the first opening 520. The suspended part of the second intermediate layer 532 may be referred to as an unsupported section or region 536. The second intermediate layer 532 may be composed of any electrically insulating or dielectric material capable of serving as an adhesive sufficient for bonding the second substrate 508 to the first intermediate layer 516, and which may be initially provided as a pre-existing film or sheet of a desired thickness. Accordingly, the material of the second intermediate layer 532 is one that may be applied to the first intermediate layer 516 as a pre-existing or dry film, such as by lamination. Examples of compositions of the second intermediate layer 532 include, but are not limited to, photoresist, BCB, polyimide, or SU8. The resulting structure disposed on the first substrate 504 may be considered as a binary laminate that includes the first intermediate layer 516 and the second intermediate layer 532. The thickness of the second intermediate layer 532 may be less than that of the first intermediate layer 516, and the viscosity of the second intermediate layer 532 may be less than that of the first intermediate layer 516, as described above.

Referring to FIG. 6, after forming the second intermediate layer 532 (i.e., applying the pre-formed material of the second intermediate layer 532 to the first intermediate layer 516), the second intermediate layer 532 may be soft-baked (heated) at a desired temperature for a desired period of time. This application of heat may cause deformation (e.g., tenting or buckling) in the unsupported region 536 of the second intermediate layer 532. Consequently, the heat applied and the surface tension of the material of the second intermediate layer 532 may cause the unsupported region 536 to migrate (e.g., pull back or flow) away from the first opening 520. In this manner, the soft-baking step may be characterized as fully or partially removing the unsupported region 536 by fully or partially reopening the first opening 520 or in effect creating a second opening 640 in the second intermediate layer 532 between the first opening 520 and the via 524. Generally, the temperature and duration of the soft-baking step are selected to be sufficient for removing the unsupported region 536 as just described, but insufficient to cause substantial cross-linking in the second intermediate layer 532. In some implementations, the soft-bake temperature may range from 60 to 120° C. for a duration ranging from 5 sec to 1 hr. As also illustrated in FIG. 6, a residual part of the unsupported region 536 may coat a part of the wall defining the first opening 520 but does not fully coat the contact pad 512.

Referring to FIG. 7, after forming the second intermediate layer 532 the two substrates 504 and 508 may then be aligned and bonded together as described above in conjunction with FIG. 3. In contrast to FIG. 3, however, in the present embodiment no etching or other type of bottom-clear step is needed in preparation for 3D interconnect metallization in the via 524, as the metallization pathway to the contact pad 512 has already been effectively cleared as a result of the pre-bond soft-baking step just described. Hence, 3D interconnect metallization and any subsequent post-bonding processes may then be performed as described above in conjunction with FIG. 4 without the bottom-clear step.

From the foregoing, it can be seen that the subject matter disclosed herein may be applied to various electronic packaging applications, such as semiconductor circuit boards, semiconductor interposers, system-in-packages (SiPs), chip stack multi-chip modules (MCMs), 3D integrated circuits (3D ICs), other 3D packages, other through-substrate interconnects (through-wafer interconnects or TWIs, through-silicon vias or TSVs), MEMS packages and heterogeneous packages composed of any combination of the above substrates/packages.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for fabricating an electronic package, the method comprising:
    forming a first intermediate layer on a first substrate such that the first intermediate layer covers a contact pad disposed on the first substrate, the first intermediate layer comprising an electrically insulating material having a first viscosity;
    forming an opening through the first intermediate layer to expose the contact pad;
    forming an un-patterned second intermediate layer on the first intermediate layer, the second intermediate layer comprising an adhesive having a second viscosity less than the first viscosity, wherein a region of the second intermediate layer obstructs the contact pad;
    removing the region to re-expose the contact pad through the opening;
    aligning a second substrate with the first substrate such that a via of the second substrate is aligned with the opening;
    after forming the first intermediate layer on the first substrate and after forming the second intermediate layer on the first intermediate layer, bonding the first substrate and the second substrate together by bringing the second substrate into contact with the second intermediate layer and applying a force to at least one of the first substrate and the second substrate while heating the second intermediate layer; and
    forming an interconnect in contact with the contact pad by depositing an electrically conductive material through the via and the opening.

2. The method of claim 1, comprising curing the first intermediate layer prior to bonding.

3. The method of claim 1, wherein the first intermediate layer is photo-definable, and forming the opening comprises subjecting the first intermediate layer to a photolithography process.

4. The method of claim 1, wherein the first intermediate layer is not photo-definable, and forming the opening comprises subjecting the first intermediate layer to a photolithography process by utilizing a photoresist disposed on the first intermediate layer.

5. The method of claim 1, wherein the material of the first intermediate layer and the adhesive of the second intermediate layer have the same composition, and comprising curing the first intermediate layer prior to bonding, and wherein the second intermediate layer is not cured.

6. The method of claim 1, wherein the material of the first intermediate layer and the adhesive of the second intermediate layer have different compositions.

7. The method of claim 1, comprising at least one of:
    wherein removing the region is done after bonding;
    wherein removing the region is done after bonding and, after forming the second intermediate layer, the region is disposed on the contact pad, and wherein removing the region comprises etching;
    wherein removing the region is done after bonding, and forming the second intermediate layer comprises performing a step selected from the group consisting of spin-coating, spray-coating, dip-coating, flow-coating, and lamination.

8. The method of claim 1, comprising at least one of:
    wherein removing the region is done prior to bonding;
    wherein removing the region is done prior to bonding, and comprises heating the second intermediate layer such that the region migrates away from the opening;
    wherein removing the region is done prior to bonding, and comprises heating the second intermediate layer such that the region migrates away from the opening, and wherein heating is done at a temperature ranging from 60 to 120° C.;
    wherein removing the region is done prior to bonding, and forming the second intermediate layer comprises applying the adhesive as a pre-formed film on the first intermediate layer.

9. The method of claim 1, wherein bonding comprises at least one of:
    bonding comprises applying a force ranging from 0.001 kg/cm² to 200 kg/cm²;
    bonding comprises applying a force while the second intermediate layer is at a temperature ranging from 80 to 250° C.;
    bonding comprises applying a force while the second intermediate layer is at a temperature at which an insubstantial amount of cross-links are formed in the second intermediate layer;
    bonding is done under a condition in which the viscosity of the second intermediate layer ranges from 1% to 99% of the viscosity of the first intermediate layer.

10. The method of claim 1, wherein the formed second intermediate layer has a thickness selected from the group consisting of: a thickness ranging from 1 to 10 µm; and a thickness ranging from 1% to 25% of a thickness of the first intermediate layer.

11. The method of claim 1, wherein the adhesive of the second intermediate layer is selected from the group consisting of photoresist, epoxy-based photoresist, polyimide, polyparaxylylene, liquid crystal polymer, benzocyclobutene, and SU8.

12. The method of claim 1, wherein the material of the first intermediate layer is selected from the group consisting of photoresist, epoxy-based photoresist, polyimide, polyparaxylylene, liquid crystal polymer, benzocyclobutene, metal oxide, metalloid oxide, metal nitride, metalloid nitride, glass, quartz, diamond-like carbon, and SU8.

13. An electronic package fabricated according to the method of claim 1.

14. An electronic package, comprising:
a first substrate;
an electrically conductive contact pad disposed on the first substrate;
a first intermediate layer disposed on the first substrate, the first intermediate layer comprising an electrically insulating material having a first viscosity and a first opening aligned with the contact pad;
a second substrate comprising a via aligned with the first opening, wherein at least one of the first substrate and the second substrate comprises a semiconductor material;
an electrically insulating layer disposed on the second substrate;
a second intermediate layer disposed on the first intermediate layer and having a smaller thickness than the first intermediate layer, the second intermediate layer comprising a second opening aligned with the via, wherein the second intermediate layer comprises an adhesive having a composition sufficient for bonding the second substrate to the second intermediate layer by thermocompression bonding and having a second viscosity less than the first viscosity, wherein the second intermediate layer and the electrically insulating layer are separate layers; and
an electrically conductive interconnect contacting the contact pad and extending through the first opening, the second opening and the via.

15. The electronic package of claim 14, wherein the material of the first intermediate layer and the adhesive of the second intermediate layer have the same composition, the first intermediate layer is in a cured state, and the second intermediate layer is in an uncured state.

16. The electronic package of claim 14, comprising at least one of:
wherein the material of the first intermediate layer and the adhesive of the second intermediate layer have different compositions;
wherein the material of the first intermediate layer and the adhesive of the second intermediate layer have different compositions, and the material of the first intermediate layer has a non-adhesive composition.

17. The electronic package of claim 14, wherein the adhesive of the second intermediate layer comprises a material selected from the group consisting of:
a material having an insubstantial amount of cross-links;
a material selected from the group consisting of photoresist, epoxy-based photoresist, polyimide, polyparaxylylene, liquid crystal polymer, benzocyclobutene, and SU8; and
both of the foregoing.

18. The electronic package of claim 14, wherein the material of the first intermediate layer is selected from the group consisting of photoresist, epoxy-based photoresist, polyimide, polyparaxylylene, liquid crystal polymer, benzocyclobutene, metal oxide, metalloid oxide, metal nitride, metalloid nitride, glass, quartz, diamond-like carbon, and SU8.

19. The electronic package of claim 14, wherein the viscosity of the second intermediate layer ranges from 1% to 99% of the viscosity of the first intermediate layer.

20. The electronic package of claim 14, wherein the second intermediate layer has a thickness selected from the group consisting of: a thickness ranging from 1 to 10 μm; and a thickness ranging from 1% to 25% of a thickness of the first intermediate layer.

* * * * *